United States Patent

Ohkubo et al.

[11] Patent Number: 6,151,369
[45] Date of Patent: Nov. 21, 2000

[54] DIGITAL BROADCAST RECEIVER

[75] Inventors: Tadatoshi Ohkubo; Masahiro Tsujishita; Kenichi Taura; Masayuki Ishida; Masakazu Morita, all of Tokyo, Japan

[73] Assignee: Mitsubishi Denki Kabushiki Kaisha, Tokyo, Japan

[21] Appl. No.: 09/044,862

[22] Filed: Mar. 20, 1998

[30] Foreign Application Priority Data

Apr. 25, 1997 [JP] Japan ...................................... 9-109368

[51] Int. Cl.[7] .................................................. H04L 27/22
[52] U.S. Cl. ............................................................... 375/332
[58] Field of Search ...................................... 375/332, 375, 375/376, 327; 334/89; 331/46

[56] References Cited

U.S. PATENT DOCUMENTS 5,970,397  10/1999  Klank et al. ............................. 455/139

FOREIGN PATENT DOCUMENTS

| | | |
|---|---|---|
| 0529421A2 | 8/1992 | European Pat. Off. . |
| 0653858A2 | 5/1995 | European Pat. Off. . |
| 2307155 | 5/1997 | United Kingdom . |
| 2310118 | 8/1997 | United Kingdom . |
| 2313270 | 11/1997 | United Kingdom . |
| 2313527 | 11/1997 | United Kingdom . |
| 2319935 | 6/1998 | United Kingdom . |

*Primary Examiner*—Stephen Chin
*Assistant Examiner*—Kevin M. Burd

[57] ABSTRACT

To control the oscillation frequency of a local oscillator, a digital broadcast receiver demodulates a phase-reference symbol contained in an orthogonal frequency-division multiplexed broadcast signal to obtain an array of complex values, selects several sets of values from the array, multiplies each selected value by the complex conjugate of a value offset by N positions in the array (where N is a fixed integer that may be equal to zero), averages the results in each set, takes differences between the average values, or between sums of these average values, thereby obtains two difference values, and calculates a frequency offset from the difference values. Each set of values is taken from positions at which the known reference-symbol values satisfy certain conditions in relation to the known values at adjacent positions.

19 Claims, 5 Drawing Sheets

DIGITAL BROADCAST RECEIVER

BACKGROUND OF THE INVENTION

The present invention relates to a method of tuning a local oscillator in a digital broadcast receiver to receive broadcasts that employ quadrature phase-shift keying (hereinafter, QPSK) and orthogonal frequency-division multiplexing (hereinafter, OFDM), and to a digital broadcast receiver using this method.

QPSK-OFDM broadcasts have multiple subcarrier signals, on which data are transmitted in parallel. Each subcarrier signal is modulated separately, then the modulated subcarriers are combined and up-converted to the broadcast frequency to create the QPSK-OFDM broadcast signal.

Reception of a QPSK-OFDM signal requires that a local oscillator in the receiver generate a signal tuned in relation to the broadcast frequency. The local oscillator signal is used to down-convert the received signal to an intermediate-frequency signal, which is then demodulated to obtain the subcarrier phase-shift data. If the local-oscillator frequency is too high or too low, the demodulated phase shifts will be incorrect.

The phase shifts have nominal radian values of zero, $\pi/2$, $\pi$, and $\pi/2$. A conventional method of tuning control multiplies the demodulated phase data by four, modulo $2\pi$, so that these nominal values all become zero. The sum of the results for all subcarriers is a phase error signal which can be used to control the local oscillator. Correct tuning is maintained by controlling the frequency of the local oscillator so as to reduce the phase error signal to zero.

The conventional method has the advantage of producing an error value automatically, by a simple and direct calculation, but the error value has an inherent ambiguity of $\pi/2$. The reason is that multiplication by four converts a phase error of $\pi/2$ to a phase error of $2\pi$, which is the same as a phase error of zero. The conventional method is accordingly limited to correcting small frequency offsets, such as frequency offsets causing phase errors smaller than $\pi/4$.

SUMMARY OF THE INVENTION

An object of the present invention is to control the tuning of a digital broadcast receiver by a method that is simple and direct, and is also unambiguous.

The invented method tunes the oscillation frequency of a local oscillator in a digital broadcast receiver by receiving a QPSK-OFDM broadcast signal and demodulating, from the received signal, a phase-reference symbol with known values $z_k$, thus obtaining an array of complex-valued frequency-domain data $X'(\omega_k)$ where k varies over a range of integers and the $\omega_k$ are subcarrier frequencies.

At least four sets of positions k are selected in the array: a first set of positions at which the known values $z_k$ and $z_{k-1}$ differ by zero radians, a second set of positions at which $z_k$ and $z_{k-1}$ differ by $\pi$ radians, a third set of positions at which $z_{k+1}$ and $z_k$ differ by zero radians, and a fourth set of positions at which $z_{k+1}$ and $z_k$ differ by $\pi$ radians.

The $X'(\omega_k)$ value in each selected position is multiplied by the complex conjugate of $X'(\omega_{k-N})$ to obtain a value $Y'_k$, where N is a fixed integer such that $z_k$ is equal to $z_{k-N}$. N may be equal to zero.

The additive mean of the resulting $Y'_k$ values is calculated separately for each set of positions. If there are only four sets, this operation yields a first value $X_1$, a second value $X_2$, a third value $X_3$, and a fourth value $X_4$. A frequency offset is calculated from a first difference between $X_1$ and $X_2$, and a second difference between $X_3$ and $X_4$. The oscillation frequency of the local oscillator is controlled according to the calculated frequency offset.

Various further conditions may be placed on the selected positions. Most simply, a difference of $\pi/2$ radians can be required between $z_{k+1}$ and $z_k$ in the first and second sets, and between $z_k$ and $z_{k-1}$ in the third and fourth sets.

The first set may, however, also include a number of positions at which $z_{k+1}$ and $z_k$ differ by zero radians, and an equal number of positions at which $z_{k+1}$ and $z_k$ differ by $\pi$ radians; likewise the second set. The third set may also include a number of positions at which $z_k$ and $z_{k-1}$ differ by zero radians, and an equal number of positions at which $z_k$ and $z_{k-1}$ differ by $\pi$ radians; likewise the fourth set.

The equal-number requirement can be removed by splitting the first set of positions into three sets, according to whether the difference between $z_{k+1}$ and $z_k$ is zero, $\pi/2$, or $\pi$, and calculating a separate additive mean for each of these three sets. The first value $X_1$ is then the sum of the three additive mean values. The second, third, and fourth sets are also split into three sets each, so that $X_2$, $X_3$, and $X_4$ are each the sum of three separate mean values.

Before the frequency offset is calculated, the first difference may be normalized by division by the sum of $X_1$ and $X_2$, and the second difference by division by the sum of $X_3$ and $X_4$. The frequency offset can be calculated from the difference between the first and second differences, or from the sum of the first and second differences divided by the difference between the first and second differences.

The invented digital broadcast receiver comprises data selectors, averaging means, a pair of subtractors, and a frequency offset detector that carry out the operations described above.

The invented method is simple because it requires only simple arithmetic operations such as averaging and subtraction. The method is direct because it produces a single pair of differences from which the frequency offset is calculated directly. The method is unambiguous in that phase errors of $\pi/2$ are not misrepresented as zero.

DETAILED DESCRIPTION OF THE INVENTION

Embodiments of the invention will be described with reference to the attached illustrative drawings, following a brief description of the QPSK-OFDM digital broadcasting system.

An OFDM broadcast divides digital data among a number (K) of subcarrier signals, where K is typically more than a thousand. The K subcarrier signals have a constant frequency spacing $F_S$. The OFDM signal is broadcast as a continuous series of frames, each consisting of a certain number M of OFDM symbols. Each OFDM symbol comprises K sub-symbols, one sub-symbol being encoded per subcarrier. In QPSK-OFDM, the sub-symbols represent the dibits '00,' '01,' '10,' and '11,' which are mapped onto the complex numbers 1, j, −1, and −j (where j is a square root of minus one), and are encoded as subcarrier phase shifts of zero, $\pi/2$, $\pi$, and $-\pi/2$ radians.

The subcarrier signals are combined by complex addition. One frame of the resulting signal s(t) can be described by equation (1) below, in which t is a time variable, $T_S$ is the duration of one symbol, $Z_{m,k}$ is the complex value (1, j, −1, or −j) of the m-th sub-symbol transmitted on the k-th subcarrier, and k ranges over the integers from −K/2 to K/2, inclusive.

$$s(t) = \sum_{m=0}^{M-1} \sum_{k=-K/2}^{K/2} z_{m,k} b(t - mT_s) \exp(2j\pi k F_s(t - mT_s)) \quad (1)$$

The symbol exp denotes the exponential function. $F_S$ and $T_S$ are related by $T_S=1/F_S$. The angular frequency $\omega_k$ of the k-th subcarrier is given by the following formula.

$$\omega_k = 2\pi k F_S \quad (2)$$

The letter b in equation (1) denotes a function equal to unity on the interval between zero and $T_S$, and equal to zero elsewhere, as defined by equation (3) below.

$$b(t) = \begin{cases} 1 & 0 < t < T_s \\ 0 & \text{otherwise} \end{cases} \quad (3)$$

The first symbol (m=0) in each frame is a null symbol, in which the signal level is reduced to zero to indicate the beginning of the frame, as described in equation (4).

$$z_{0,k}=0 \ (k=-K/2, \ldots, K/2) \quad (4)$$

The next symbol (m=1) is a phase-reference symbol containing known data $z_k$ for each subcarrier. The known data $z_k$ vary according to the value of k. These known data become the values of $z_{1,k}$ in each frame, as indicated by equation (5).

$$z_{1,k}=z_k \ (k=-K/2, \ldots, K/2) \quad (5)$$

The known data $z_k$ combine to give the reference-symbol waveform x(t) described by equation (6) below. This is the baseband waveform produced in the transmitter, before up-conversion to the broadcast frequency.

$$x(t) = \sum_{k=-K/2}^{K/2} z_k b(t - T_s) \exp(j\omega_k(1 - T_s)) \quad (6)$$

First embodiment

A first embodiment of the invented method of tuning control, and a first embodiment of the invented digital broadcast receiver, will be described with reference to FIG. 1, which is a block diagram of the digital broadcast receiver.

The conventional part of this digital broadcast receiver comprises an antenna 1 that receives a QPSK-OFDM broadcast signal, a radio-frequency amplifier 2 that amplifies the received broadcast signal, a mixer 3 that down-converts the amplified signal to an intermediate-frequency signal, an intermediate-frequency amplifier 4 that amplifies the intermediate-frequency signal, an orthogonal demodulator 5 that demodulates the amplified intermediate-frequency signal to produce in-phase (I) and quadrature (Q) baseband signals, an analog-to-digital converter (ADC) 6 that converts these baseband signals to a complex-valued digital signal, a fast-Fourier-transform processor 7 that executes a fast Fourier transform (FFT) on this digital signal to obtain the sub-symbol data for each subcarrier, an error-correcting processor 8 that detects and corrects errors in the sub-symbol data, an output terminal 9 to which the sub-symbol data are supplied, and a voltage-controlled oscillator (VC0) 10. The voltage-controlled oscillator 10 is used as a local oscillator that supplies the mixer 3 with a signal tuned to a frequency differing from the QPSK-OFDM broadcast frequency by a fixed amount.

The novel part of this digital broadcast receiver comprises a frequency offset detector 11, a pair of subtractors 12a and 12b, four averagers 13a, 13b, 13c, and 13d, four data selectors 14a, 14b, 14c, and 14d, and a self-multiplier 15. The frequency offset detector, subtractors, averagers, and data selectors form a frequency error detector 101, within which the frequency offset detector and subtractors form a frequency error evaluator 201.

Separate arithmetic and logic circuits can be provided for each of the elements from the frequency offset detector it to the self-multiplier 15, as shown, or the functions of all these elements can be carried out by, for example, a suitably programmed digital signal processor (DSP).

Next, the operation of the first embodiment will be described.

In each frame, the self-multiplier 15 receives an array of complex-valued data $X'(\omega_k)$ (k=−K/2, . . . , K/2) in the frequency domain, comprising one value for each subcarrier frequency, which the fast-Fourier-transform processor 7 produces from the demodulated and digitized phase-reference symbol. The self-multiplier 15 multiplies each of these values by the complex conjugate of the same value, generating an array of values $Y'_k$. Using an asterisk to denote the complex conjugate value, $$Y'_k = X'(\omega_k) X'(\omega_k)^* \quad (7)$$

The array of values $Y'_k$ (k=−K/2, . . . , K/2) is supplied to the data selectors 14a, 14b, 14c, and 14d.

Data selector 14a selects the $Y'_k$ values from a first set of positions k in the array, and supplies the selected $Y'_k$ values to averager 13a. The positions k in the first set are the positions at which phase-reference sub-symbol $z_k$ and its lower adjacent sub-symbol $z_{k-1}$ and upper adjacent sub-symbol $z_{k+1}$ satisfy both of the conditions $z_k z_{k-1}^* = 1$ and $z_{k+1} z_k^* = \pm j$.

Data selector 14b selects the $Y'_k$ values from a second set of positions k, at which the conditions $z_k z_{k-1}^* = -1$ and $z_{k+1} z_k^* = \pm j$ are both satisfied, and supplies the selected $Y'_k$ values to averager 13b.

Data selector 14c selects the $Y'_k$ values from a third set of positions k, at which the conditions $z_{k+1} z_k^* = -1$ and $z_k z_{k-1}^* = \pm j$ are both satisfied, and supplies the selected $Y'_k$ values to averager 13c.

Data selector 14d selects the $Y'_k$ values from a fourth set of positions k, at which the conditions $z_{k+1} z_k^* = -1$ and $z_k z_{k-1}^* = \pm j$ are both satisfied, and supplies the selected $Y'_k$ values to averager 13d.

In terms of phase angle, the condition $z_k z_{k-1}^* = 1$ means that $z_k$ and $z_{k-1}$ differ by zero radians, the condition $z_k z_{k-}$ $1^* = \pm j$ means that the $z_k$ and $z_{k-1}$ differ by $\pi/2$ radians, and the condition $z_k z_{k-1} = -1$ means that $z_k$ and $z_{k-1}$ differ by $\pi$ radians. Similar descriptions apply to the conditions on $z_{k+1}$ and $z_k$.

Averager 13a calculates the additive mean value $X_1$ of the $Y'_k$ values selected by data selector 14a in one frame. Similarly, averager 13b calculates the additive mean value $X_2$ of the $Y'_k$ values selected by data selector 14b in one frame. Subtractor 12a subtracts mean value $X_2$ from mean value $X_1$, and supplies the difference $\alpha$ to the frequency offset detector 11.

In like manner, averager 13c calculates the additive mean value $X_3$ of the $Y'_k$ values selected by data selector 14c in one frame, averager 13d calculates the additive mean value $X_4$ of the $Y'_k$ values selected by data selector 14d in one frame, and subtractor 12b subtracts mean value $X_4$ from mean value $X_3$ and supplies the difference $\beta$ to the frequency offset detector 11.

The frequency offset detector 11 detects frequency offset from the differences $\alpha$ and $\beta$ received from subtractors 12a and 12b, and controls the voltage-controlled oscillator 10 so as to correct the offset, as described below.

From equation (6), the waveform $x_k(t)$ of the k-th phase-reference sub-symbol has the following expression.

$$x_k(t) = z_k b(t - T_S) \exp(j \omega_k (t - T_S)) \quad (8)$$

A Fourier transform converts $x_k(t)$ to the following frequency-domain function $X_k(\omega)$, in which $\omega$ is a frequency variable.

$$X_k(\omega) = z_k T_s \frac{\sin \frac{\omega - \omega_k}{2} T_s}{\frac{\omega - \omega_k}{2} T_s} \exp\left(-j \frac{\omega - \omega_k}{2} T_s\right) \quad (9)$$

From equations (6) and (8), $$x(t) = \sum_{i=-K/2}^{K/2} x_i(t) \quad (10)$$

Similarly, the Fourier transform $X(\omega)$ of $x(t)$ can be written as in equation (11).

$$X(\omega) = \sum_{i=-K/2}^{K/2} X_i(\omega) \quad (11)$$

Ideally, the oscillator used to up-convert the baseband signal in the transmitter and the voltage-controlled oscillator 10 used for down-conversion in the receiver operate at the same frequency, symbol synchronization is perfect, and the fast-Fourier-transform processor 7 receives the correct data for each symbol. In practice, there may be a frequency offset $\Delta F$ between the two oscillator frequencies, and a timing offset $\Delta t$ from the correct symbol boundaries in the data received by the fast-Fourier-transform processor 7. The actual received waveform $x'(t)$ of the phase-reference symbol will then differ from the form given above, and its Fourier transform $X'(\omega)$ will involve $\Delta F$ and $\Delta t$ as in equation (12).

$$X'(\omega) = \sum_{i=-K/2}^{K/2} X_i(\omega - \Delta\omega) \exp(-j\omega \Delta t) \quad (12)$$

The value output by the fast-Fourier-transform processor 7 for k-th sub-symbol in the phase-reference symbol is accordingly given by the sum in equation (13).

$$X'(\omega_k) = \sum_{i=-K/2}^{K/2} X_i(\omega_k - \Delta\omega) \exp(-j\omega_k \Delta t) \quad (13)$$

The term with the largest magnitude in this sum will normally be the term in which the subscript i is equal to k. The two terms in which i is equal to k+1 will normally have the next largest magnitudes. Terms in which i is equal to k±2, k±3, ... will have generally decreasing magnitudes. The value of $X'(\omega_k)$ can accordingly be approximated as follows.

$$X'(\omega_k) \approx \{X_{k-1}(\omega_k - \Delta\omega) + X_k(\omega_k - \Delta\omega) + X_{k+1}(\omega_k - \Delta\omega)\} \exp(-j \omega_k \Delta t) \quad (14)$$

This approximation can be rewritten as follows:

$$X'(\omega_k) \approx (A z_{k-1} + B z_k + C z_{k+1}) \exp(-j(\omega_k \Delta t - \theta)) \quad (15)$$

where A, B, C and $\theta$ have the following values.

$$A = \frac{\sin\theta}{\pi + \theta} \quad (16)$$

$$B = \frac{\sin\theta}{\theta} \quad (17)$$

$$C = \frac{-\sin\theta}{\pi - \theta} \quad (18)$$

$$\theta = \frac{(\Delta\omega) T_s}{2} = \pi(\Delta F) T_s \quad (19)$$

The self-multiplier 15 therefore outputs approximately the following value $Y'_k$.

$$Y'_k = (A z_{k-1} + B A z_k + C A z_{k+1}) \times (A z^*_{k-1} + B A z^*_k + C A z^*_{k+1}) \quad (20)$$
$$= A^2 + B^2 + C^2 + AB(z_k z^*_{k-1} + z^*_k z_{k-1}) +$$
$$BC(z_{k+1} z^*_k + z^*_{k+1} z_k) +$$
$$AC(z_{k+1} z^*_k z_k z^*_{k-1} + z_{k+1} z_k z^*_k z^*_{k-1})$$

In the data selected by data selector 14a, $z_k z_{k-1}^* = 1$ and $z_{k+1} z_k^* = \pm j$, so the mean value $X_1$ produced by averager 13a has the following value.

$$X_1 = A^2 + B^2 + C^2 + 2AB \quad (21)$$

Similarly, in the data selected by data selector 14b, $z_k z_{k-1}^* = -1$ and $z_{k+1} z_k^* = \pm j$, so the mean value $X_2$ produced by averager 13b has the following value.

$$X_2 = A^2 + B^2 + C^2 - 2AB \quad (22)$$

In the data selected by data selector 14c, $z_{k+1} z_k^* = 1$ and $z_k z_{k-1}^* = -1$, so the mean value $X_3$ produced by averager 13c has the following value.

$$X_3 = A^2 + B^2 + C^2 + 2BC \quad (23)$$

Similarly, in the data selected by data selector 14d, $z_{k+1} z_k^* = -1$ and $z_k z_{k-1}^* = \pm j$, so the mean value $X_4$ produced by averager 13d has the following value.

$$X_4 = A^2 + B^2 + C^2 - 2BC \tag{24}$$

The value α found by subtractor 12a and the value β found by subtractor 12b are accordingly given as follows:

$$\alpha = 4AB \tag{25}$$

$$\beta = 4BC \tag{26}$$

From equations (16), (17), and (18), AB and BC are given as follows.

$$AB = \frac{\sin^2\theta}{\theta(\pi + \theta)} \tag{27}$$

$$BC = \frac{-\sin^2\theta}{\theta(\pi - \theta)} \tag{28}$$

The values of AB and BC depend only on the frequency offset ΔF, so it is comparatively easy to determine the frequency offset ΔF from AB and BC. The frequency offset ΔF can be derived directly from AB and BC as follows.

$$\Delta F = \frac{1}{T_s} \frac{BC + AB}{BC - AB} \tag{29}$$

Since α and β are respectively proportional to AB and BC, the frequency offset ΔF can also be determined by dividing the sum of α and β by the difference between α and β.

$$\Delta F = \frac{1}{T_s} \frac{\beta + \alpha}{\beta - \alpha} \tag{30}$$

The frequency offset detector 11 in the first embodiment calculates the frequency offset ΔF from the outputs α and β of subtractors 12a and 12b as in equation (30), and controls the voltage-controlled oscillator 10 so as to reduce the frequency offset to zero. From the above equations, it is clear that detection of the frequency offset is not affected by the timing offset Δt. It is also clear that the frequency offset is obtained from simple and direct arithmetic operations, and does not require computationally intensive operations such as multiple comparisons or an inverse fast Fourier transform.

Since the invented method employs the approximation given in equations (14) and (15), arbitrarily large frequency offsets cannot be detected accurately, but within the range of validity of the approximation, the invented method detects frequency offset without ambiguity.

Under certain conditions, the operations described above can be modified in various ways. For example, if data selectors 14a and 14b select the same number of data, the two averaging operations performed in the averager 13a and averager 13b can be combined into a single averaging operation performed after the subtraction operation performed by subtractor 12a. A similar modification can be made if data selectors 14c and 14d select the same number of data. If all four data selectors select the same number of data, the averaging process can be replaced by a simple addition process.

Since data values are selected from only some of the positions in the array, the self-multiplication operation can be performed after the selection of data from these positions, to eliminate unnecessary computation. Second embodiment The second embodiment is useful when the phase-reference symbol pattern $z_{-K/2}, \ldots, z_{K/2}$ satisfies a repeating condition of the following type:

$$x_k = z_{k-N} \tag{31}$$

N is a fixed integer equal to or greater than three (N≧3). The value of k can range from −K/2 to K/2, but is restricted to odd values modulo N; that is, (k mod N) mod 2)=1.

Figure 1:
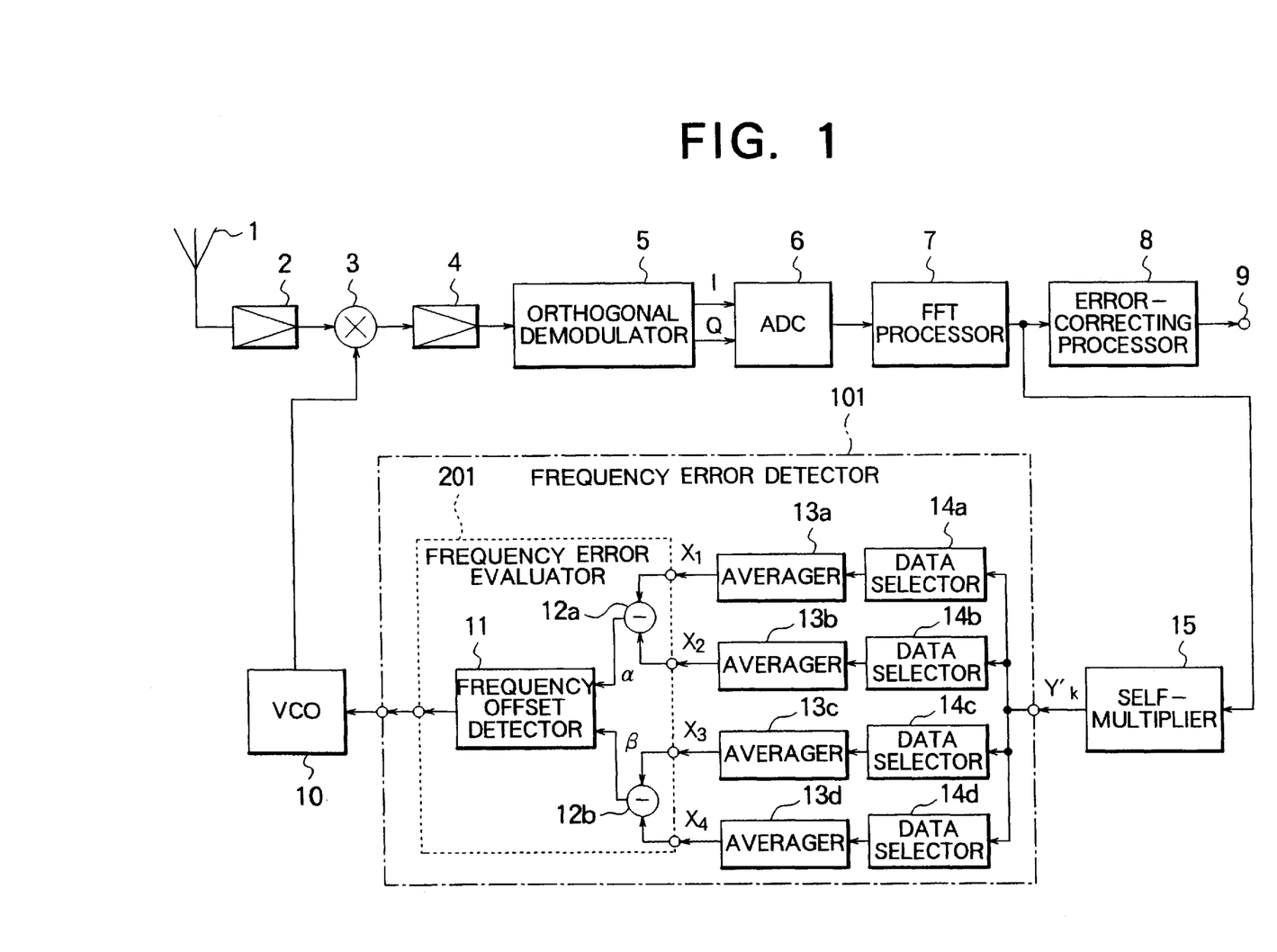
FIG. 1 is a block diagram of a first embodiment of the invented digital broadcast receiver.
Figure 2:
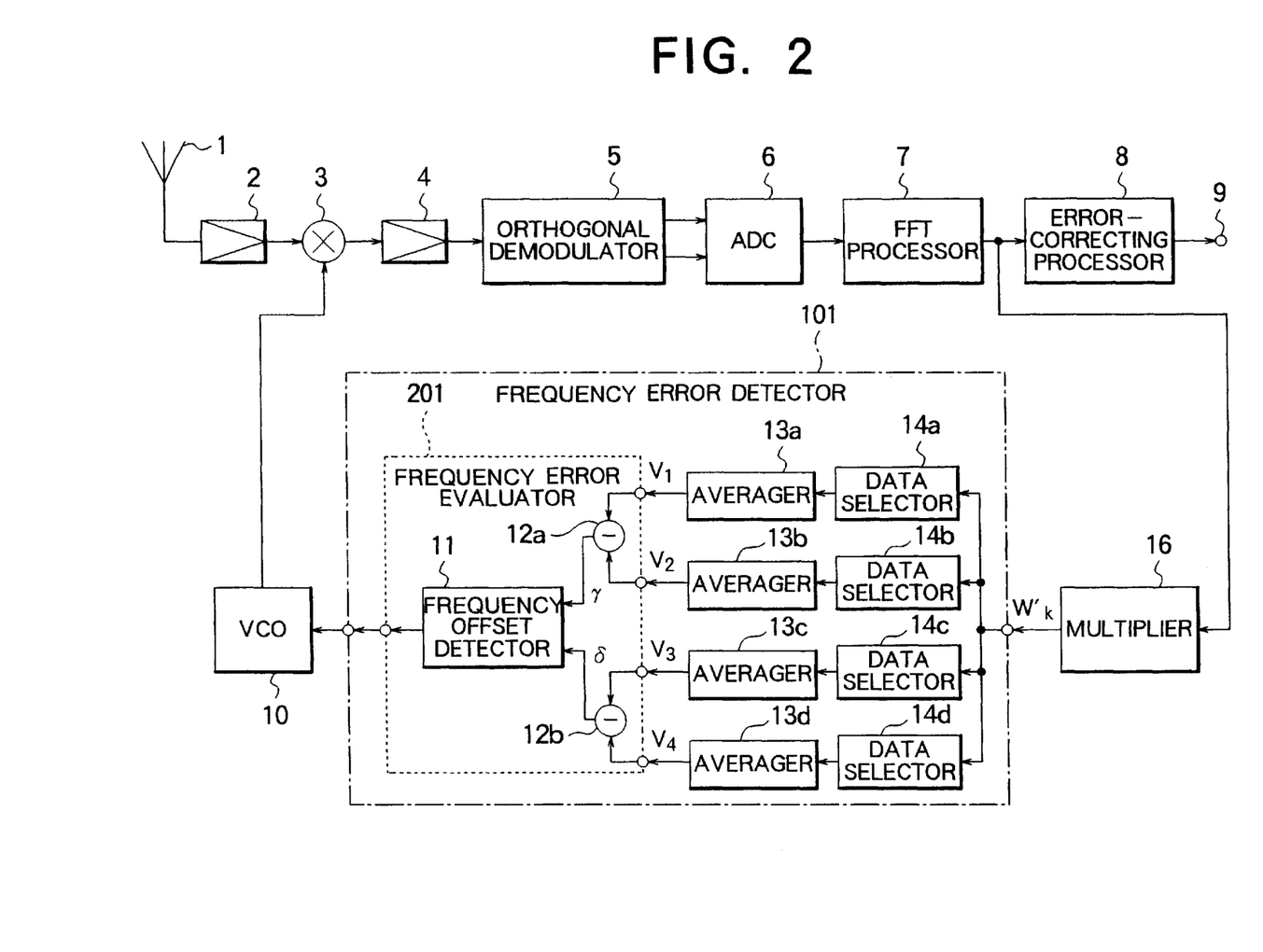
FIG. 2 is a block diagram of a second embodiment of the invented digital broadcast receiver.

FIG. 2 shows a block diagram of a receiver according to the second embodiment, using the same reference numerals as in FIG. 1 for identical elements. The only differing element is the multiplier 16, which replaces the self-multiplier 15 of the first embodiment.

The multiplier 16 receives the phase-reference symbol values X'($\omega_k$) (k=−K/2 . . . , K/2) from the fast-Fourier-transform processor 7, and performs the following multiplication operation on the values of X'($\omega_k$) for which k satisfies the conditions given above, namely $z_k = z_{k-N}$ and (k mod N) mod 2)=1.

$$W'_k = X'(\omega_k) X'(\omega_{k-N})^* \tag{32}$$

The multiplier 16 thus multiplies each of these values X'($\omega_k$) by the complex conjugate of a nominally identical value X'($\omega_{k-N}$).

The resulting data are provided to data selectors 14a, 14b, 14c, and 14d, which operate as in the first embodiment. Data selector 14a selects W'$_k$ values from positions k satisfying the conditions $z_k z_{k-1}^* = 1$ and $z_{k+1} z_k^* = \pm j$, and supplies the selected W'$_k$ values to averager 13a. Data selector 14b selects W'$_k$ values from positions k satisfying the conditions $z_k z_{k-1}^* = -1$ and $z_{k+1} z_k^* = \pm j$, and supplies the selected W'$_k$ values to averager 13b. Data selector 14c selects W'$_k$ values from positions k satisfying the conditions $z_{k+1} z_k^* = 1$ and $z_k z_{k-1}^* = \pm j$, and supplies the selected W'$_k$ values to averager 13c. Data selector 14d selects W'$_k$ values from positions k satisfying the conditions $z_{k+1} z_k^* = -1$ and $z_k z_{k-1}^* = \pm j$, and supplies the selected W'$_k$ values to averager 13d.

Averager 13a calculates the additive mean value $V_1$ of the W'$_k$ data selected by data selector 14a in one frame. Averager 13b calculates the additive mean value $V_2$ of the W'$_k$ data selected by data selector 14b in one frame. Subtractor 12a subtracts mean value $V_2$ from mean value $V_1$, and supplies the difference r to the frequency offset detector 11.

In like manner, averager 13c calculates the additive mean value $V_3$ of the W'$_k$ data selected by data selector 14c in one frame, averager 13d calculates the additive mean value $V_4$ of the W'$_k$ data selected by data selector 14d in one frame, and subtractor 12b subtracts mean value $V_4$ from mean value $V_3$ and supplies the difference δ to the frequency offset detector 11.

The frequency offset detector 11 calculates the frequency offset from the supplied differences γ and δ, and controls the voltage-controlled oscillator 10 accordingly.

As in the first embodiment, the sub-symbol value X'($\omega_k$) can be expressed by equation (15), in which A, B, C, and θ are defined by equations (16) to (19). The value W'$_k$ obtained by the multiplier 16 accordingly has the expression given in equation (33).

$$\begin{aligned} W'_k &= (A z_{k-1} + B z_k + C z_{k+1}) \exp(-j(\omega_k \Delta t - \theta)) \\ &\quad (A z_{k-1}^* + B z_k^* + C z_{k+1}^*) \exp(j(\omega_{k-N} \Delta t - \theta)) \\ &= (A z_{k-1} + B z_k + C z_{k+1}) \\ &\quad (A z_{k-1}^* + B z_k^* + C z_{k+1}^*) \exp(j(\omega_N \Delta t)) \end{aligned} \tag{33}$$

-continued $$= \{A^2 + B^2 + C^2 +$$
$$AB(z_k z_{k-1}^* + z_k^* z_{k-1}) + BC(z_{k+1} z_k^* + z_{k+1}^* z_k) +$$
$$AC(z_{k+1} z_k^* z_k z_{k-1}^* + z_{k+1}^* z_k z_k^* z_{k-1})\} \exp(-j\omega_N \Delta t)$$

Since the conditions $z_k z_{k-1}^* = 1$ and $z_{k+1} z_k^* = \pm j$ are satisfied in the data received by averager 13a, from equation (33), the first mean value $V_1$ can be expressed as follows.

$$V_1 = (A^2 + B^2 + C^2 + 2AB)\exp(j\,\omega_N \Delta t) \quad (34)$$

Since the conditions $z_k z_{k-1}^* = -1$ and $z_{k+1} z_k^* = \pm j$ are satisfied in the data received by averager 13b, the second mean value $V_2$ can be expressed as follows.

$$V_2 = (A^2 + B^2 + C^2 - 2AB)\exp(j\,\omega_N \Delta t) \quad (35)$$

Since the conditions $z_{k+1} z_k^* = 1$ and $z_k z_{k-1}^* = \pm j$ are satisfied in the data received by averager 13a, the third mean value $V_3$ can be expressed as follows.

$$V_3 = (A^2 + B^2 + C^2 + 2BC)\exp(j\,\omega_N \Delta t) \quad (36)$$

Since the conditions $z_{k+1} z_k^* = -1$ and $z_k z_{k-1}^* = \pm j$ are satisfied in the data received by averager 13b, the fourth value $V_4$ can be expressed as follows.

$$V_4 = (A^2 + B^2 + C^2 - 2BC)\exp(j\,\omega_N \Delta t) \quad (37)$$

The differences $\gamma$ and $\delta$ obtained by subtractors 12a and 12b have the following values.

$$\gamma = 4AB \exp(j\,\omega_N \Delta t) \quad (38)$$

$$\delta = 4BC \exp(j\,\omega_N \Delta t) \quad (39)$$

The values of AB and BC have the values given in equations (27) and (28), depending on the frequency offset $\Delta F$ but not on the timing offset $\Delta t$. The frequency offset $\Delta F$ can be obtained directly from AB and BC as in equation (29). Since $\gamma$ and $\delta$ are proportional to AB and BC, the frequency offset $\Delta F$ can also be obtained as follows.

$$\Delta F = \frac{1}{T_s} \frac{\delta + \gamma}{\delta - \gamma} \quad (40)$$

Operating as in the first embodiment, the frequency offset detector 11 calculates the frequency offset $\Delta F$ from equation (40), and controls the voltage-controlled oscillator 10 so as to reduce the frequency offset to zero.

As noted in the first embodiment, the averaging operations and subtraction operations performed in the frequency error detector 101 can be modified in various ways if data selectors 14a and 14b select equal numbers of data, or if data selectors 14c and 14d select equal numbers of data.

The first embodiment is a special case of the second embodiment, in which N is equal to zero. In this special case the condition $z_k = z_{k-N}$ is satisfied automatically, while the condition ((k mod N) mod 2)=1 is undefined and can be disregarded. There is accordingly no real difference in meaning between $\alpha$ and $\gamma$, between $\beta$ and $\delta$, between $W'_k$ and $Y'_k$, or between $V'_i$ and $X'_i$ (i=1, 2, 3, 4). The descriptions given below using $\alpha$, $\beta$, $X_i$, and $Y_k$ apply equally well if these symbols are replaced by $\gamma$, $\delta$, $V_i$, and $W_k$.

Third embodiment

Figure 3:
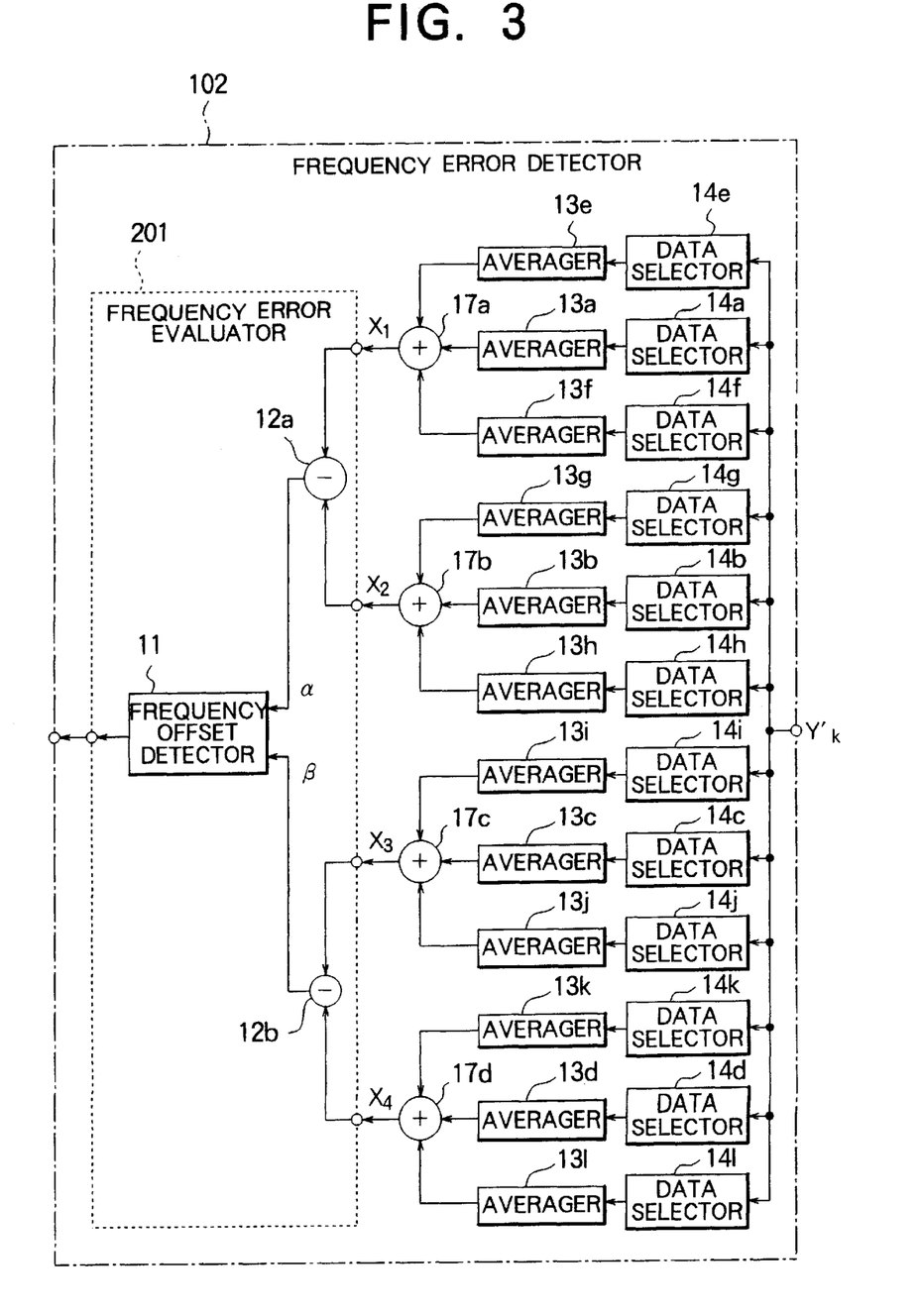
FIG. 3 is a block diagram of the frequency error detector in a third embodiment of the invented digital broadcast receiver.

The third embodiment replaces the frequency error detector 101 used in the first and second embodiments with an altered frequency error detector 102. The frequency error detector 102 will be described below as receiving the $Y'_k$ values output by the self-multiplier 15 used in the first embodiment, but the frequency error detector 102 can also be used in combination with the multiplier 16 of the second embodiment.

Referring to FIG. 3, the altered frequency error detector 102 comprises data selectors 14a to 14l, averagers 13a to 13l, adders 17a to 17d, and the frequency error evaluator 201 of the first embodiment, having subtractors 12a and 12b and a frequency offset detector 11.

Data selector 14a selects $Y'_k$ values from positions k at which the conditions $z_k z_{k-1}^* = 1$ and $z_{k+1} z_k^* = \pm j$ are satisfied, and supplies the selected $Y'_k$ values to averager 13a. Data selector 14e selects $Y'_k$ values from positions k at which the conditions $z_k z_{k-1}^* = 1$ and $z_{k+1} z_k^* = 1$ are satisfied, and supplies the selected $Y'_k$ values to averager 13e. Data selector 14f selects $Y'_k$ values from positions k at which the conditions $z_k z_{k-1}^* = 1$ and $z_{k+1} z_k^* = -1$ are satisfied, and supplies the selected $Y'_k$ values to averager 13f.

Data selector 14b selects $Y'_k$ values from positions k at which the conditions $z_k z_{k-1}^* = -1$ and $z_{k+1} z_k^* = \pm j$ are satisfied, and supplies the selected $Y'_k$ values to averager 13b. Data selector 14g selects $Y'_k$ values from positions k at which the conditions $z_k z_{k-1} = -1$ and $z_{k+1} z_k^* = 1$ are satisfied, and supplies the selected $Y'_k$ values to averager 13g. Data selector 14h selects $Y'_k$ values from positions k at which the conditions $z_k z_{k-1}^* = -1$ and $z_{k+1} z_k^* = -1$ are satisfied, and supplies the selected $Y'_k$ values to averager 13h.

Data selector 14c selects $Y'_k$ values from positions k at which the conditions $z_{k+1} z_k^* = 1$ and $z_k z_{k-1}^* = \pm j$ are satisfied, and supplies the selected $Y'_k$ values to averager 13c. Data selector 14i selects $Y'_k$ values from positions k at which the conditions $z_{k+1} z_k^* = 1$ and $z_{k-1} z_k^* = 1$ are satisfied, and supplies the selected $Y'_k$ values to averager 13i. Data selector 14j selects $Y'_k$ values from positions k at which the conditions $z_{k+1} z_k^* = 1$ and $z_{k-1} z_k^* = 1$ are satisfied, and supplies the selected $Y'_k$ values to averager 13j.

Data selector 14d selects $Y'_k$ values from positions k at which the conditions $z_{k+1} z_k^* = -1$ and $z_k z_{k-1} = \pm j$ are satisfied, and supplies the selected $Y'_k$ values to averager 13d. Data selector 14k selects $Y'_k$ values from positions k at which the conditions $z_{k+1} z_k^* = -1$ and $z_{k-1} z_k^* = 1$ are satisfied, and supplies the selected $Y'_k$ values to averager 13k. Data selector 14l selects $Y'_k$ values from positions k at which the conditions $z_{k+1} z_k^* = -1$ and $z_{k-1} z_k^* = -1$ are satisfied, and supplies the selected $Y'_k$ values to averager 13l.

Averagers 13a to 13l calculate the additive mean values of the respectively provided data for one frame.

Adder 17a takes the sum of the mean values output by averagers 13a, 13e, and 13f, while adder 17b takes the sum of the mean values output by averagers 13b, 13g, and 13h. Subtractor 12a subtracts the sum $X_2$ supplied by adder 17b from the sum $X_1$ supplied by adder 17a, and provides the difference to the frequency offset detector 11.

Adder 17c takes the sum of the mean values output by averagers 13c, 13i, and 13j, while adder 17d takes the sum of the mean values output by averagers 13d, 13k, and 13l. Subtractor 12b subtracts the sum $X_4$ supplied by adder 17d from the sum $X_3$ supplied by adder 17c, and provides the difference to the frequency offset detector 11.

As in the preceding embodiments, the frequency offset detector 11 calculates the frequency offset from the two provided difference values, and controls the voltage-controlled oscillator 10 so as to reduce the frequency offset to zero.

From equation (20), the data averaged by averagers 13a, 13e, and 13f have the three values given below.

$A^2+B^2+C^2+2AB$ $A^2+B^2+C^2+2AB+2BC+2AC$ $A^2+B^2+C^2+2AB-2BC-2AC$

Similarly, the data averaged by averagers 13b, 13g, and 13h have the values given below.

$A^2+B^2+C^2-2AB$ $A^2+B^2+C^2-2AB+2BC-2AC$ $A^2+B^2+C^2-2AB-2BC+2AC$

The data averaged by averagers 13c, 13i, and 13j have the values given below.

$A^2+B^2+C^2+2BC$ $A^2+B^2+C^2+2BC+2AB+2AC$ $A^2+B^2+C^2+2BC-2AB-2AC$

Similarly, the data averaged by averagers 13d, 13k, and 13l have the values given below.

$A^2+B^2+C^2-2BC$ $A^2+B^2+C^2-2BC+2AB-2AC$ $A^2+B^2+C^2-2BC-2AB+2AC$

The differences output by subtractors 12A and 12B are accordingly equal to 12AB and 12BC, respectively.

The frequency offset detector 11 can calculate the frequency offset ΔF in the same way as in the first embodiment. Since the third embodiment uses more input data than the first embodiment, the calculations are less likely to be affected by random noise in the subcarriers.

If the frequency error detector 102 of the third embodiment is combined with the multiplier 16 of the second embodiment, the data selectors 14a to 14l select from the data $W'_k$ output by the multiplier 16 instead of the data $Y'_k$ output by the self-multiplier 15, but the selection conditions are the same as described above, and similar effects are obtained.

The averaging operations, addition operations, and subtraction operations performed in the frequency error detector 102 can be modified in various ways if various combinations of data selectors 14a to 14l select equal numbers of data. For example, if data selectors 14a to 14l all select the same numbers of data values, each successive data value selected by data selectors 14a, 14e, and 14f can be added to, and each data value selected by data selectors 14b, 14g, and 14h subtracted from, a total value which is used in place of the output of subtractor 12a, and the output of subtractor 12b can be similarly replaced with a total value produced only by addition and subtraction operations.

Fourth embodiment

Figure 4:
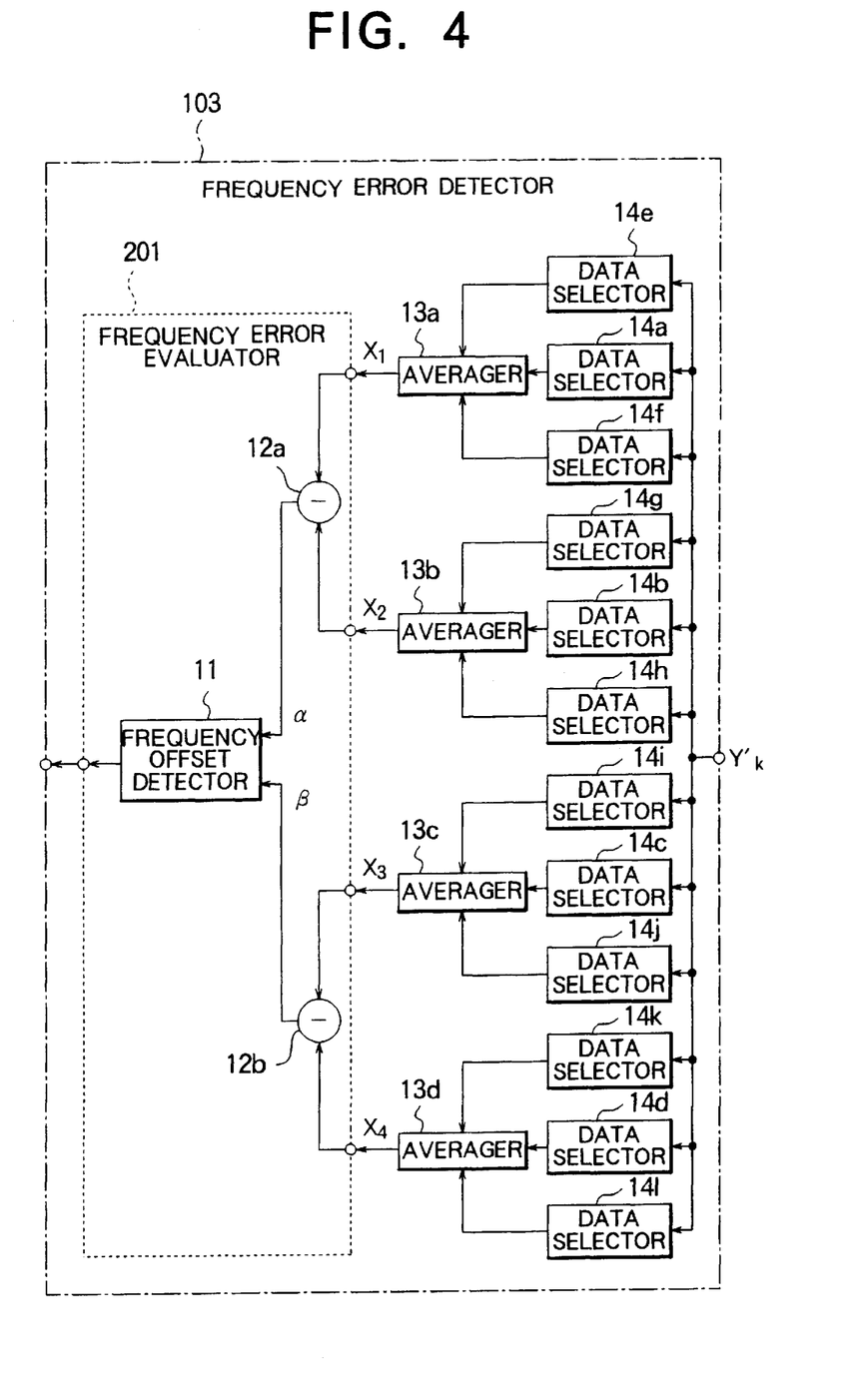
FIG. 4 is a block diagram of the frequency error detector in a fourth embodiment of the invented digital broadcast receiver.

The fourth embodiment makes further modifications to the structure of the frequency error detector.

FIG. 4 shows the frequency error detector 103 of the fourth embodiment, using the same reference numerals as in FIG. 3 for identical elements. Data selectors 14a to 14l satisfy the same selection conditions as in the third embodiment. Data selectors 14e to 14l also satisfy a pair-wise equality condition on the number of values selected.

In the fourth embodiment, the $Y'_k$ values selected by data selectors 14a, 14e, and 14f are supplied to a single averager 13a, and data selectors 14e and 14f are adapted to select equal numbers of $Y'_k$ values. Similarly, the $Y'_k$ values selected by data selectors 14b, 14g, and 14h are supplied to a single averager 13b, with data selectors 14g and 14h selecting equal numbers of values; the $Y'_k$ values selected by data selectors 14c, 14i, and 14j are supplied to a single averager 13c, with data selectors 14i and 14j selecting equal numbers of values; and the $Y'_k$ values selected by data selectors 14d, 14k, and 14l are supplied to a single averager 13d, with data selectors 14k and 14l selecting equal numbers of values. Subtractor 12a subtracts the mean value $X_2$ output by averager 13b from the mean value $X_1$ output by averager 13a. Subtractor 12b subtracts the mean value $X_4$ output by averager 13d from the mean value $X_3$ output by averager 13c.

As in the third embodiment, the data selected by data selector 14a have the following value.

$A^2+B^2+C^2+2AB$

The data selected by data selectors 14e and 14f have the following values, respectively.

$A^2+B^2+C^2+2AB+2BC+2AC$ $A^2+B^2+C^2+2AB-2BC-2AC$

Since data selectors 14e and 14f select equal numbers of data values, the BC and AC terms cancel out, and averager 13a produces the following mean value:

$A^2+B^2+C^2+2AB$

Similarly, averager 13b produces the following mean value.

$A^2+B^2+C^2-2AB$

Averagers 13c and 13d produce the following pair of mean values.

$A^2+B^2+C^2+2BC$ $A^2+B^2+C^2-2BC$

The two difference values output by subtractors 12a and 12b are accordingly the following:

4AB

4BC

The frequency offset ΔF can be obtained from these values in the same way as in the first embodiment.

The frequency error detector 103 of the fourth embodiment can also be used with the multiplier 16 of the second embodiment. Various other modifications are possible if averagers 13a and 13b receive equal numbers of values, if averagers 13c and 13d receive equal numbers of values, or if all four averagers receive equal numbers of values, as described in the first embodiment.

Fifth embodiment

Figure 5:
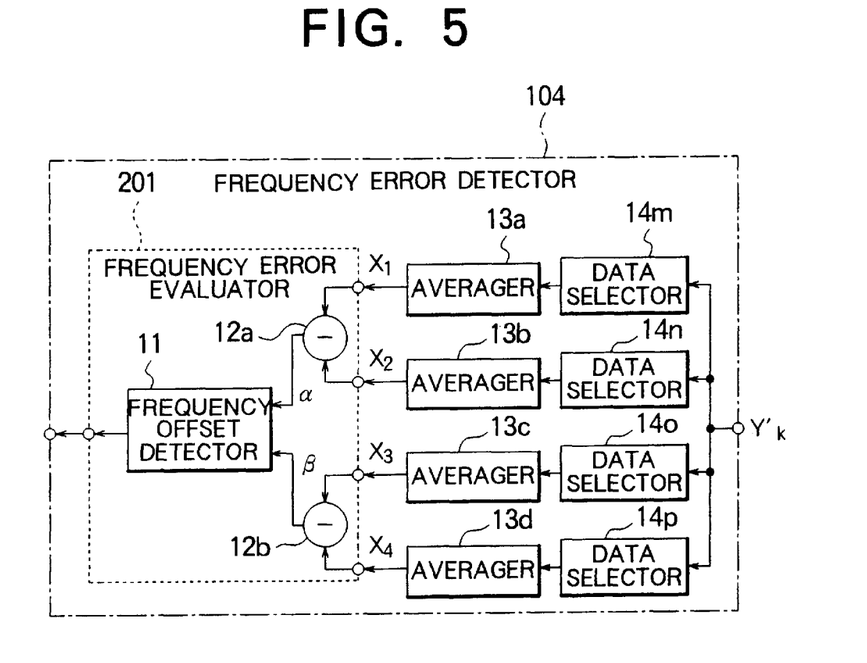
FIG. 5 is a block diagram of the frequency error detector in a fifth embodiment of the invented digital broadcast receiver.

The fifth embodiment modifies the structure of the frequency error detector in a manner suitable when the known values of the phase-reference sub-symbols $z_k$ (where k varies from $-K/2$ to $K/2$) lead naturally to selection of equal numbers of data values by each pair of data selectors that were required to select equal numbers of data values in the fourth embodiment. This means, for example, that the number of positions k at which the known data $z_k$ satisfy the selection condition of data selector 14e in the fourth embodiment is equal to the number of positions k at which the known data $z_k$ satisfy the selection condition of data selector 14f in the fourth embodiment.

FIG. 5 shows the frequency error detector 104 of the fifth embodiment, using the same reference numerals as in FIG. 3 for identical elements. Data selector 14m selects $Y'_k$ values from all positions k at which $z_k z_{k-1}^*=1$, and supplies the selected $Y'_k$ values to averager 13a. Data selector 14n selects $Y'_k$ values from all positions k at which $z_k z_{k-1}^*=-1$, and supplies the selected $Y'_k$ values to the averager 13b. Data selector 14o selects $Y'_k$ values from all positions k at which $z_{k+1} z_k^*=1$, and supplies the selected $Y'_k$ values to the averager 13c. Data selector 14p selects $Y'_k$ values from all positions k at which $z_{k+1} z_k^*=-1$, and supplies the selected $Y'_k$ values to the averager 13d.

The data selected by data selector 14a can be divided into three groups. In one group are data for positions k at which the conditions $z_k z_{k-1}=1$ and $z_{k+1} z_k^*=\pm j$ are satisfied. As in the fourth embodiment, these data have the following mean value.

$$A^2+B^2+C^2+2AB$$

The other two groups come from positions k at which the conditions $z_k z_{k-1}^*=1$ and $z_{k+1} z_k^*=1$ are satisfied, and positions k at which the conditions $z_k z_{k-1}^*=1$ and $z_{k+1} z_k^*=-1$ are satisfied. The mean values in these two groups are, respectively, $$A^2+B^2+C^2+2AB+2BC+2AC, \text{ and}$$

$$A^2+B^2+C^2+2AB-2BC-2AC$$

By assumption, these two groups contain equal numbers of values, so the BC and AC terms cancel out, and the mean value $X_1$ found by averager 13a is:

$$A^2+B^2+C^2+2AB$$

Similarly, averager 13b, averager 13c, and averager 13d produce the following mean values as $X_2$, $X_3$, and $X_4$.

$$A^2+B^2+C^2-2AB$$

$$A^2+B^2+C^2+2BC$$

$$A^2+B^2+C^2-2BC$$

The two difference values output by subtractors 12a and 12b are accordingly the following:

$$4AB$$

$$4BC$$

In short, the fifth embodiment produces the same results as the fourth embodiment, with simpler selection conditions.

If data selectors 14m and 14n select equal numbers of data values, the operations performed by averager 13a and 13b and subtractor 12a can by modified, e.g. by subtracting before averaging. A similar modification is possible if data selectors 14o and 14p select equal numbers of data values. If all four data selectors 14m, 14n, 14o, and 14p select equal numbers of data values, then still further variations are possible, e.g. by replacing the averaging process with a summation process.

Sixth embodiment

Figure 6:
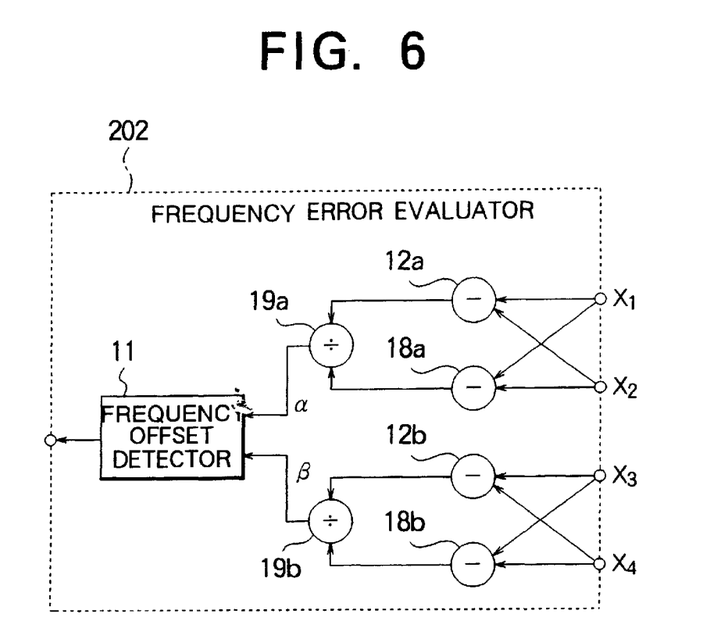
FIG. 6 is a block diagram of the frequency error evaluator in a sixth embodiment of the invented digital broadcast receiver.

The sixth embodiment modifies the structure of the frequency error evaluator. In the description below, it will be assumed that this modification is made to the frequency error evaluator in the first embodiment.

FIG. 6 shows the structure of the frequency error evaluator 202 in the sixth embodiment, using the same reference numerals as in FIG. 1 for equivalent elements.

The mean values $X_1$ and $X_2$ output by averagers 13a and 13b in the first embodiment are received in the sixth embodiment by an adder 18a and subtractor 12a. From equations (21) and (22), adder 18a and subtractor 12a produce the following values, respectively.

$$2(A^2+B^2+C^2)$$

$$4AB$$

Similarly, the mean values $X_3$ and $X_4$ output by averagers 13c and 13d are received by an adder 18b and subtractor 12b, which produce the following values.

$$2(A^2+B^2+C^2)$$

$$4BC$$

Dividers 19a and 19b normalize the differences output by subtractors 12a and 12b by dividing these differences by the outputs of adders 18a and 18b, obtaining the following pair of normalized difference values.

$$2AB/(A^2+B^2+C^2)$$

$$2BC/(A^2+B^2+C^2)$$

The frequency offset detector 11 detects the frequency offset $\Delta F$ from the outputs of dividers 19a and 19b and controls the voltage-controlled oscillator 10 accordingly, operating in the same way as in the first embodiment. The purpose of the normalization is to reduce the effect of amplitude variations in the received subcarrier signals.

The sixth embodiment can also be applied in any of the configurations shown in the second to fifth embodiments.

Seventh embodiment

The seventh embodiment modifies the operation of the frequency offset detector 11.

When the frequency offset $\Delta F$ is obtained as in equation (30) from the values $\alpha$ and $\beta$ used in the first embodiment, if the frequency offset is extremely small, noise can have a significant effect on the value of either $\alpha$ or $\beta$, or both, leading to a large effect when their sum is divided by their difference as in equation (30). For frequency offsets up to half the subcarrier spacing $F_S$, however, $\alpha$ is a monotonic increasing function of $\Delta F$, and $\beta$ is a monotonic decreasing function of $\Delta F$, as can be inferred from equations (25) and (26), in view of equations (16) to (19).

In the seventh embodiment, accordingly, for frequency offsets up to half the subcarrier frequency spacing $F_S$, the frequency offset detector 11 takes the difference between $\alpha$ and $\beta$.

Amplified by a suitable factor, this difference becomes the value according to which the frequency offset detector 11 controls the voltage-controlled oscillator 10. If the amplified difference is outside the range corresponding to half the subcarrier frequency spacing $F_S$ the frequency offset detector 11 operates as in the first embodiment, using equation (30). The frequency offset detector 11 is thus able to correct both large and small frequency offsets accurately, without the risk that small frequency offset corrections will be unduly distorted by noise.

The frequency offset detectors 11 in the second through sixth embodiments can follow a similar procedure to avoid distortion due to noise.

Various modifications of the preceding embodiments have been described above, but those skilled in the art will recognize that further modifications are possible within the scope claimed below.

What is claimed is:

1. A method of tuning an oscillation frequency of a local oscillator to receive a QPSK-OFDM signal with subcarrier frequencies $\omega_k$, where k ranges over a set of consecutive integers in subcarrier frequency order, having a phase-reference symbol with known data $z_k$, where $z_k$ is encoded in subcarrier $\omega_k$, comprising the steps of:

(a) receiving and demodulating said phase-reference symbol to obtain an array of complex values $X'(\omega_k)$ representing frequency-domain data;

(b) selecting at least one first set of positions k at which $z_k$ and $z_{k-1}$ differ by zero radians;

(c) selecting at least one second set of positions k at which $z_k$ and $z_{k-1}$ differ by $\pi$ radians;

(d) selecting at least one third set of positions k at which $z_{k+1}$ and $z_k$ differ by zero radians;

(e) selecting at least one fourth set of positions k at which $z_{k+1}$ and $z_k$ differ by $\pi$ radians;

(f) calculating, for each position k selected in said steps (b), (c), (d), and (e), a value $Y'_k$ equal to $X'(\omega_k)$ multiplied by a complex conjugate of $X'(\omega_{k-N})$, where N is a fixed integer such that $z_k$ is equal to $z_{k-N}$;

(g) calculating a separate mean value of the $Y'_k$ values in each said first set of positions k, and if there is more than one said first set of positions k, summing the separate means values calculated for each first set of positions k, thereby obtaining a first value $X_1$;

(h) calculating a separate mean value of the $Y'_k$ values in each said second set of positions k, and if there is more than one said second set of positions k, summing the separate means values calculated for each second set of positions k, thereby obtaining a second value $X_2$;

(i) calculating a separate mean value of the $Y'_k$ values in each said third set of positions k, and if there is more than one said third set of positions k, summing the separate means values calculated for each third set of positions k, thereby obtaining a third value $X_3$;

(j) calculating a separate mean value of the $Y'_k$ values in each said fourth set of positions k, and if there is more than one said fourth set of positions k, summing the separate means values calculated for each fourth set of positions k, thereby obtaining a fourth value $X_4$;

(k) calculating a first difference between said first value $X_1$ and said second value $X_2$;

(l) calculating a second difference between said third value $X_3$ and said fourth value $X_4$;

(m) calculating a frequency offset from said first difference and said second difference; and (n) adjusting said oscillation frequency according to said frequency offset.

2. The method of claim 1, wherein N is equal to zero.

3. The method of claim 1, wherein said step (b) selects just one said first set of positions k, said step (c) selects just one said second set of positions k, said step (d) selects just one said third set of positions k, and said step (e) selects just one said fourth set of positions k.

4. The method of claim 3, wherein the positions k in said first set and said second set are positions at which $z_{k+1}$ and $z_k$ differ by $\pi/2$ radians, and the positions k in said third set and said fourth set are positions at which $z_k$ and $z_{k-1}$ differ by $\pi/2$ radians.

5. The method of claim 3, wherein:

said first set of positions k includes a first number of positions k at which $z_{k+1}$ and $z_k$ differ by zero radians, an equal number of positions k at which $z_{k+1}$ and $z_k$ differ by $\pi$ radians, and an arbitrary number of positions k at which $z_{k+1}$ and $z_k$ differ by $\pi/2$ radians;

said second set of positions k includes a second number of positions k at which $z_{k+1}$ and $z_k$ differ by zero radians, an equal number of positions k at which $z_{k+1}$ and $z_k$ differ by $\pi$ radians, and an arbitrary number of positions k at which $z_{k+1}$ and $z_k$ differ by $\pi/2$ radians;

said third set of positions k includes a third number of positions k at which $z_k$ and $z_{k-1}$ differ by zero radians, an equal number of positions k at which $z_k$ and $z_{k-1}$ differ by $\pi$ radians, and an arbitrary number of positions k at which $z_k$ and $z_{k-1}$ differ by $\pi/2$ radians; and said fourth set of positions k includes a fourth number of positions k at which $z_k$ and $z_{k-1}$ differ by zero radians, an equal number of positions k at which $z_k$ and $z_{k-1}$ differ by $\pi$ radians, and an arbitrary number of positions k at which $z_k$ $z_{k-1}$ differ by $\pi/2$ radians.

6. The method of claim 1, wherein:

said step (b) selects one first set of positions k at which $z_{k+1}$ and $z_k$ differ by zero radians, another first set of positions k at which $z_{k+1}$ and $z_k$ differ by $\pi$ radians, and another first set of positions k at which $z_{k+1}$ and $z_k$ differ by $\pi/2$ radians;

said step (c) selects one second set of positions k at which $z_{k+1}$ and $z_k$ differ by zero radians, another second set of positions k at which $z_{k+1}$ and $z_k$ differ by $\pi$ radians, and another second set of positions k at which $z_{k+1}$ and $z_k$ differ by $\pi/2$ radians;

said step (d) selects one third set of positions k at which $z_k$ and $z_{k-1}$ differ by zero radians, another third set of positions k at which $z_k$ and $z_{k-1}$ differ by $\pi$ radians, and another third set of positions k at which $z_k$ and $z_{k-1}$ differ by $\pi/2$ radians; and said step (e) selects one fourth set of positions k at which $z_k$ and $z_{k-1}$ differ by zero radians, another fourth set of positions k at which $z_k$ and $z_{k-1}$ differ by $\pi$ radians, and another fourth set of positions k at which $z_k$ and $z_{k-1}$ differ by $\pi/2$ radians.

7. The method of claim 1, comprising the further steps of:

(o) normalizing said first difference by dividing said first difference by a sum of said first value $X_1$ and said second value $X_2$; and (p) normalizing said second difference by dividing said second difference by a sum of said third value $X_3$ and said fourth value $X_4$;

said frequency offset being calculated from said first difference and said second difference as normalized in said steps (o) and (p).

8. The method of claim 1, wherein said step (m) calculates said frequency offset from a difference between said first difference and said second difference.

9. The method of claim 1, wherein said step (m) calculates said frequency offset from a sum of said first difference and said second difference, divided by a difference between said first difference and said second difference.

10. A digital broadcast receiver for receiving a QPSK-OFDM signal with subcarrier frequencies $\omega_k$, where k ranges over a set of consecutive integers in subcarrier frequency order, having a local oscillator with a controllable oscillation frequency, a mixer for down-converting said QPSK-OFDM signal to an intermediate-frequency signal by mixing said QPSK-OFDM signal with a signal generated by said local oscillator, and demodulating circuits for obtaining an array of complex-valued frequency-domain data $X'(\omega_k)$ from said intermediate-frequency signal, said data $X'(\omega_k)$ representing subcarrier phase information of said QPSK-OFDM signal, said QPSK-OFDM signal including a phase-reference symbol with known data $z_k$, where $z_k$ and $X'(\omega_k)$ are encoded in subcarrier $\omega_k$, comprising:

- a multiplier for multiplying the data $X'(\omega_k)$ demodulated from said phase-reference symbol by a complex conjugate of $X'(\omega_{k-N})$, where N is a fixed integer such that $z_k$ is equal to $z_{k-N}$, thereby obtaining an array of values $Y'_k$;
- at least one first data selector coupled to said multiplier, for selecting $Y'_k$ values from a first set of positions k, at which $z_k$ and $z_{k-1}$ differ by zero radians;
- at least one second data selector coupled to said multiplier, for selecting $Y'_k$ values from a second set of positions k, at which $z_k$ and $z_{k-1}$ differ by $\pi$ radians;
- at least one third data selector coupled to said multiplier, for selecting $Y'_k$ values from a first set of positions k, at which $z_{k+1}$ and $z_k$ differ by zero radians;
- at least one fourth data selector coupled to said multiplier, for selecting $Y'_k$ values from a fourth set of positions k, at which $z_{k+1}$ and $z_k$ differ by $\pi$ radians;
- at least one first averaging means, coupled to said first data selector, for calculating an additive mean value of the $Y_k$ values selected by said first data selector;
- at least one second averaging means, coupled to said second data selector, for calculating an additive mean value of the $Y_k$ values selected by said second data selector;
- at least one third averaging means, coupled to said third data selector, for calculating an additive mean value of the $Y_k$ values selected by said third data selector;
- at least one fourth averaging means, coupled to said fourth data selector, for calculating an additive mean value of the $Y_k$ values selected by said fourth data selector;
- a first subtractor, coupled to said first averaging means and said second averaging means, for calculating a first difference between the additive mean value calculated by said first averaging means and the additive mean value calculated by said second averaging means;
- a second subtractor, coupled to said third averaging means and said fourth averaging means, for calculating a second difference between the additive mean value calculated by said third averaging means and the additive mean value calculated by said fourth averaging means; and
- a frequency offset detector coupled to said first subtractor and said second subtractor, for calculating a frequency offset from said first difference and said second difference, and adjusting the oscillation frequency of said local oscillator according to said frequency offset.

11. The digital broadcast receiver of claim 10, wherein N is equal to zero.

12. The digital broadcast receiver of claim 10, having just one said first data selector, one said second data selector, one said third data selector, and one said fourth data selector.

13. The digital broadcast receiver of claim 12, wherein said first data selector and said second data selector select $Y'_k$ values from positions k at which $z_{k+1}$ and $z_k$ differ by $\pi/2$ radians, and said third data selector and said fourth data selector select $Y'_k$ values from positions k at which $z_k$ and $z_{k-1}$ differ by $\pi/2$ radians.

14. The digital broadcast receiver of claim 12, wherein:

said first data selector selects a first number of $Y'_k$ values from positions k at which $z_{k+1}$ and $z_k$ differ by zero radians, an equal number of $Y'_k$ values from positions k at which $z_{k+1}$ and $z_k$ differ by $\pi$ radians, and an arbitrary number of $Y'_k$ values from positions k at which $z_{k+1}$ and $z_k$ differ by $\pi/2$ radians;

said second data selector selects a second number of $Y'_k$ values from positions k at which $z_{k+1}$ and $z_k$ differ by zero radians, an equal number of $Y'_k$ values from positions k at which $z_{k+1}$ and $z_k$ differ by $\pi$ radians, and an arbitrary number of $Y'_k$ values from positions k at which $z_{k+1}$ and $z_k$ differ by $\pi/2$ radians;

said third data selector selects a third number of $Y'_k$ values from positions k at which $z_k$ and $z_{k-1}$ differ by zero radians, an equal number of $Y'_k$ values from positions k at which $z_k$ and $z_{k-1}$ differ by $\pi$ radians, and an arbitrary number of $Y'_k$ values from positions k at which $z_k$ and $z_{k-1}$ differ by $\pi/2$ radians; and said fourth data selector selects a fourth number of values from positions k at which $z_k$ and $z_{k-1}$ differ by zero radians, an equal number of $Y'_k$ values from positions k at which $z_k$ and $z_{k-1}$ differ by $\pi$ radians, and an arbitrary number of $Y'_k$ values from positions k at which $z_k$ and $z_{k-1}$ differ by $\pi/2$ radians.

15. The digital broadcast receiver of claim 10, having one said first data selector selecting $Y'_k$ values from positions k at which $z_{k+1}$ and $z_k$ differ by zero radians, another said first selector selecting $Y'_k$ values from positions k at which $z_{k+1}$ and $z_k$ differ by $\pi$ radians, and another said first selector selecting $Y'_k$ values from positions k at which $z_{k+1}$ and $z_k$ differ by $\pi/2$ radians;

three said first averaging means for calculating additive mean values of the $Y_k$ values selected by respective first data selectors;

one said second data selector selecting $Y'_k$ values from positions k at which $z_{k+1}$ and $z_k$ differ by zero radians, another said second selector selecting $Y'_k$ values from positions k at which $z_{k+1}$ and $z_k$ differ by $\pi$ radians, and another said second selector selecting $Y'_k$ values from positions k at which $z_{k+1}$ and $z_k$ differ by $\pi/2$ radians;

three said second averaging means for calculating additive mean values of the $Y_k$ values selected by respective second data selectors;

one said third data selector selecting $Y'_k$ values from positions k at which $z_{k+1}$ and $z_k$ differ by zero radians, another said third selector selecting $Y'_k$ values from positions k at which $z_{k+1}$ and $z_k$ differ by $\pi$ radians, and another said third selector selecting $Y'_k$ values from positions k at which $z_{k+1}$ and $z_k$ differ by $\pi/2$ radians;

three said third averaging means for calculating additive mean values of the $Y_k$ values selected by respective third data selectors;

one said fourth data selector selecting $Y'_k$ values from positions k at which $z_{k+1}$ and $z_k$ differ by zero radians, another said fourth selector selecting $Y'_k$ values from positions k at which $z_{k+1}$ and $z_k$ differ by $\pi$ radians, and another said fourth selector selecting $Y'_k$ values from positions k at which $z_{k+1}$ and $z_k$ differ by $\pi/2$ radians;

three said fourth averaging means for calculating additive mean values of the $Y_k$ values selected by respective fourth data selectors;

and further comprising:

a first adder coupled to the three said first averaging means, for adding the additive mean values calculated by the three said first averaging means to obtain a first value $X_1$, and supplying said first value $X_1$ to said first subtractor;

a second adder coupled to the three said second averaging means, for adding the additive mean values calculated by the three said second averaging means to obtain a second value $X_2$, and supplying said second value $X_2$ to said first subtractor, which calculates said first difference as a difference between said first value $X_1$ and said second value $X_2$;

a third adder coupled to the three said third averaging means, for adding the additive mean values calculated by the three said third averaging means to obtain a third value $X_3$, and supplying said third value $X_3$ to said second subtractor; and a fourth adder coupled to the three said fourth averaging means, for adding the additive mean values calculated by the three said fourth averaging means to obtain a fourth value $X_4$, and supplying said fourth value $X_4$ to said second subtractor, which calculates said second difference as a difference between said third value $X_3$ and said fourth value $X_4$.

16. The digital broadcast receiver of claim 10, having one said first data selector selecting a first number of positions k at which $z_{k+1}$ and $z_k$ differ by zero radians, another said first selector selecting an equal number of positions k at which $z_{k+1}$ and $z_k$ differ by $\pi$ radians, and another said first selector selecting an arbitrary number of positions k at which $z_{k+1}$ and $z_k$ differ by $\pi/2$ radians;

one said first averaging means, calculating the additive mean value of the $Y'_k$ values selected by all three first data selectors;

one said second data selector selecting a second number of positions k at which $z_{k+1}$ and $z_k$ differ by zero radians, another said second selector selecting an equal number of positions k at which $z_{k+1}$ and $z_k$ differ by $\pi$ radians, and another said second selector selecting an arbitrary number of positions k at which $z_{k+1}$ and $z_k$ differ by $\pi/2$ radians;

one said second averaging means, calculating the additive mean value of the $Y'_k$ values selected by all three second data selectors;

one said third data selector selecting a third number of positions k at which $z_{k+1}$ and $z_k$ differ by zero radians, another said third selector selecting an equal number of positions k at which $z_{k+1}$ and $z_k$ differ by $\pi$ radians, and another said third selector selecting an arbitrary number of positions k at which $z_{k+1}$ and $z_k$ differ by $\pi/2$ radians;

one said third averaging means, calculating the additive mean value of the $Y'_k$ values selected by all three third data selectors;

one said fourth data selector selecting a fourth number of positions k at which $z_{k+1}$ and $z_k$ differ by zero radians, another said fourth selector selecting an equal number of positions k at which $z_{k+1}$ and $z_k$ differ by $\pi$ radians, and another said fourth selector selecting an arbitrary number of positions k at which $z_{k+1}$ and $z_k$ differ by $\pi/2$ radians; and one said fourth averaging means, calculating the additive mean value of the $Y'_k$ values selected by all three first data selectors.

17. The digital broadcast receiver of claim 10, further comprising:

a fifth adder for adding the two values received by said first subtractor to obtain a first sum;

a first divider coupled to said first subtractor and said fifth adder, for normalizing said first difference by dividing said first difference by said first sum;

a sixth adder for adding the two values received by said second subtractor to obtain a second sum;

a second divider coupled to said second subtractor and said sixth adder, for normalizing said second difference by dividing said second difference by said second sum; wherein said frequency offset detector calculates said frequency offset from the first difference as normalized by said first divider, and the second difference as normalized by said second divider.

18. The digital broadcast receiver of claim 10, wherein said frequency offset detector calculates said frequency offset from a difference between said first difference and said second difference.

19. The digital broadcast receiver of claim 10, wherein said frequency offset detector calculates said frequency offset from a sum of said first difference and said second difference, divided by a difference between said first difference and said second difference.

* * * * *